United States Patent
Zang et al.

(10) Patent No.: US 12,116,661 B2
(45) Date of Patent: Oct. 15, 2024

(54) SUPPORT STRIPS AND MASK PLATES

(71) Applicant: KUNSHAN GO-VISIONOX OPTO-ELECTRONICS CO., LTD., Kunshan (CN)

(72) Inventors: Gongzheng Zang, Kunshan (CN); Wenxing Li, Kunshan (CN); Weili Li, Kunshan (CN)

(73) Assignee: KUNSHAN GO-VISIONOX OPTO-ELECTRONICS CO, LTD., Kunshan (CN)

( * ) Notice: Subject to any disclaimer, the term of this patent is extended or adjusted under 35 U.S.C. 154(b) by 238 days.

(21) Appl. No.: 17/733,450

(22) Filed: Apr. 29, 2022

(65) Prior Publication Data
US 2022/0259714 A1 Aug. 18, 2022

Related U.S. Application Data

(63) Continuation of application No. PCT/CN2021/083859, filed on Mar. 30, 2021.

(30) Foreign Application Priority Data

May 29, 2020 (CN) .......................... 202010475484.0

(51) Int. Cl.
C23C 14/04 (2006.01)
(52) U.S. Cl.
CPC .................. *C23C 14/042* (2013.01)
(58) Field of Classification Search
CPC ....................... C23C 14/042; Y10T 428/24479
See application file for complete search history.

(56) References Cited

U.S. PATENT DOCUMENTS

| | | | |
|---|---|---|---|
| 2017/0141313 A1 | 5/2017 | Min | |
| 2017/0207390 A1* | 7/2017 | Kim | ........................ C23C 14/24 |

(Continued)

FOREIGN PATENT DOCUMENTS

| | | |
|---|---|---|
| CN | 108642440 A | 10/2018 |
| CN | 108998756 A | 12/2018 |

(Continued)

OTHER PUBLICATIONS

International Search Report and Written Opinion (International Application No. PCT/CN2021/083859) with English Translation, dated May 17, 2021, 12 pages.

(Continued)

*Primary Examiner* — Maria V Ewald
*Assistant Examiner* — Donald M Flores, Jr.
(74) *Attorney, Agent, or Firm* — Quarles & Brady LLP

(57) ABSTRACT

The present application relates to a support strip and a mask plate. The support strip includes a main body, an irregular portion, and a clamped portion. The main body has two sides in a first direction and two ends in a second direction. The irregular portion is disposed on the side of the main body. The clamped portion is disposed on the end of the main body. A first central axis of the main body, a second central axis of the clamped portion, and a first main centroid axis of a support portion all extend along the second direction. The second central axis is located on a side of the first central axis adjacent to the first main centroid axis. The first direction and the second direction are perpendicular to each other, and are parallel to a plane in which a top surface of the main body is located.

20 Claims, 8 Drawing Sheets

(56) References Cited

U.S. PATENT DOCUMENTS

2019/0062895 A1\* 2/2019 Zhang .................. C23C 14/042
2020/0102637 A1 4/2020 Kim et al.
2021/0355572 A1 11/2021 Li

FOREIGN PATENT DOCUMENTS

CN 110629156 A 12/2019
CN 111647846 A 9/2020

OTHER PUBLICATIONS

Chinese First Office Action 100191 (CN Application No. 202010475484.0) and Search Result with English Translation, dated Dec. 31, 2021, 11 pages.

\* cited by examiner

SUPPORT STRIPS AND MASK PLATES

CROSS-REFERENCE TO RELATED APPLICATIONS

This application is a continuation of international patent application PCT/CN2021/083859, filed on Mar. 30, 2021, which claims priority to Chinese Patent Application No. 202010475484.0, filed on May 29, 2020, the content of both applications are hereby incorporated by reference in their entireties.

TECHNICAL FIELD

The present application relates to the field of evaporation deposition technology.

BACKGROUND

The organic light-emitting diode (OLED) has a number of characteristics such as low driving voltage, active light emission, wide view angle, high efficiency, high response speed, and facilitation in realization of full-color large-area wall-mounted display and flexible display.

SUMMARY

A support strip and a mask plate are provided in embodiments of the present application.

According to an aspect of the present application, a support strip is provided. The support strip has a support region and a clamped region, and the support strip includes a main body, an irregular portion, and a clamped portion.

The main body is disposed in the support region. In a first direction of the main body, the main body has two sides. In a second direction of the main body, the main body has two ends.

The irregular portion is disposed in the support region, and is disposed on at least one of the two sides of the main body.

The clamped portion is disposed in the clamped region, and is disposed on at least one of the two ends of the main body.

The main body has a first central axis extending along the second direction. The clamped portion has a second central axis extending along the second direction. The support region has a first main centroid axis extending along the second direction.

The second central axis is located on a side of the first central axis adjacent to the first main centroid axis.

The first direction and the second direction are perpendicular to each other, and are parallel to a plane in which a top surface of the main body is located.

According to another aspect of the present application, a mask plate is provided. The mask plate includes a support strip described in any of the above embodiments.

In the support strip and the mask plate provided by the present application, the second central axis is located on the side of the first central axis adjacent to the first main centroid axis; that is, a force line of the axial force is located on the side of the first central axis adjacent to the first main centroid axis. By setting the position of the clamped portion relative to the main body, the second central axis of the clamped portion is offset to the side of the first central axis adjacent to the first main centroid axis. In this way, the distance between the force line of the axial force and the first main centroid axis is reduced so that the distance between the force line of the axial force and a second main centroid axis of the entire support strip is reduced. Thus, the eccentric distance is reduced, and the bending moment is reduced accordingly, thereby reducing the position shift of the support strip in the non-pulling direction (i.e., the width direction of the support strip), improving the shielding effect of the support strip, and thus improving the display effect of the display screen formed by using the mask plate in the evaporation and deposition process.

DETAILED DESCRIPTION

Figure 1:
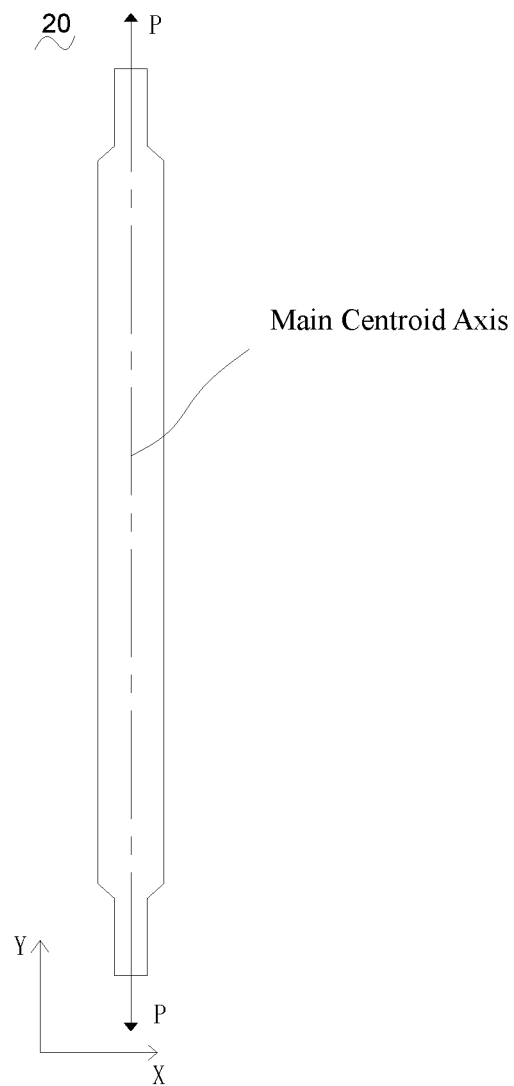
FIG. 1 is a force diagram of a support strip with a symmetrical structure.

The present application is described in detail below with reference to the related drawings. Some embodiments of the present application are shown in the drawings. However, the present application can be implemented in many different forms and not be limited to the embodiments described herein. Rather, the purpose of providing these embodiments is to provide a thorough understanding of the present application.

In the OLED manufacturing technology, the mask plate has become a vital component in the evaporation and deposition process since it can effectively control the position of the organic material deposited on the substrate. The mask plate generally includes a frame, a number of support strips, and a number of mask strips. The support strips are fixed on the frame to support the mask strips and shield the gaps between the mask strips. The mask strips define openings for the evaporation and deposition.

During a mask stretching process, the support strip may bend and deform due to the tensile force applied at two ends of the support strip, so that the position of the support strip may greatly shift in a direction with no tensile force (i.e., a direction perpendicular to the direction of the tensile force), thus deteriorating the shielding effect of the support strip as well as the display effect of a display screen formed by the evaporation and deposition process. The reason inducing this problem is as follows.

Referring to FIG. 1, when the support strip 20 is structurally symmetrical, a force line of an axial force P (e.g., a tensile force) applied on a clamped portion of the support strip 20 coincides with a main centroid axis of the support strip 20. In the present application, the term "force line" of a force is defined as a straight line drawn from the point at which the force is applied, and the line extending along the force direction. Therefore, the position of the support strip 20 may not shift in the direction where there is no tensile force (e.g., the direction X in FIG. 1).

Figure 2:
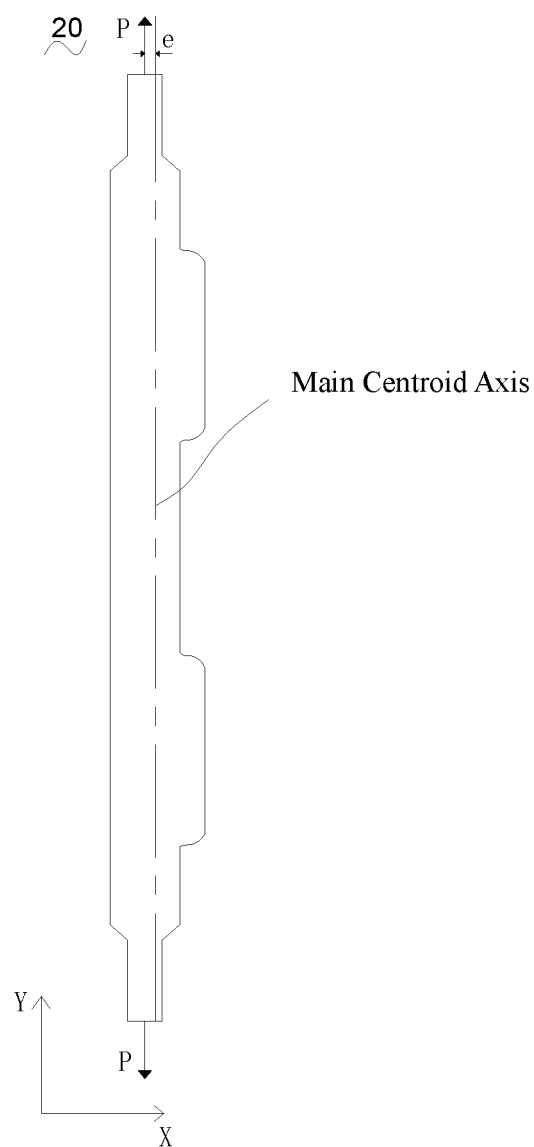
FIG. 2 is a force diagram of a support strip with an asymmetric structure.

Referring to FIG. 2, when one or more protrusions, which play a role of shielding a deposition material, are provided on the support strip 20, according to a design requirement, the support strip 20 becomes structurally asymmetric. In this case, though the position of the force line of the axial force P remains unchanged, the position of the main centroid axis of the support strip 20 changes. Thus, the force line of the axial force P and the main centroid axis of the support strip 20 are parallel but do not coincide with each other, resulting in an eccentric distance e between the force line of the axial force P and the main centroid axis of the support strip 20. Due to the existence of the eccentric distance e, there may be a stress component in the cross section of the support strip 20: M=P*e, wherein M is a bending moment, P is the axial force, and e is the eccentric distance. The support strip 20 is bent and deformed by the bending moment M and shifts the position greatly in the first direction X, thus deteriorating the shielding effect of the support strip 20 as well as the display effect of the display screen formed by the evaporation and deposition process.

In FIG. 1 and FIG. 2, the direction Y refers to the tensile force direction, and the direction X refers to the first direction. For a plane figure, a pair of orthogonal coordinate axes that make the inertia product equal to zero is called principal axes of inertia, or principal axes for short. A main centroid axis is the principal axis that passes through the centroid of the plane figure. The centroid of the top surface of the support strip is the geometric center of the top surface of the support strip.

Figure 3:
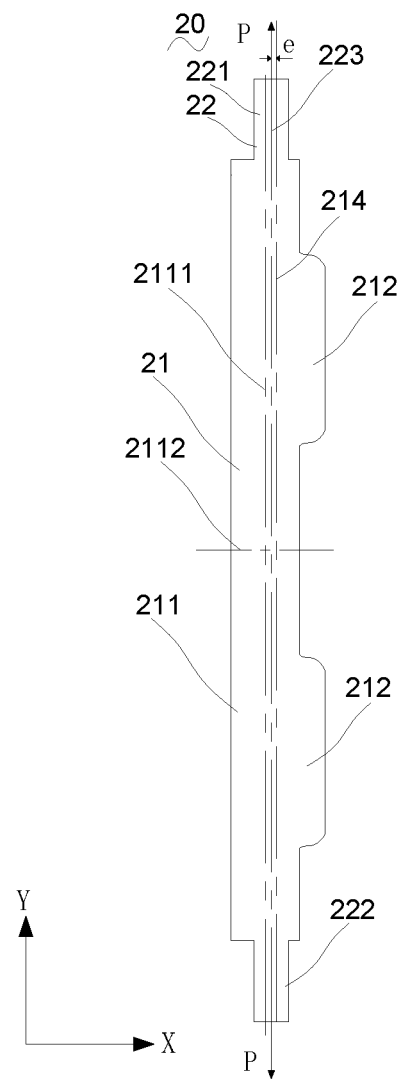
FIG. 3 is a top structural view of an embodiment of a support strip whose irregular portion includes protrusions.
Figure 8:
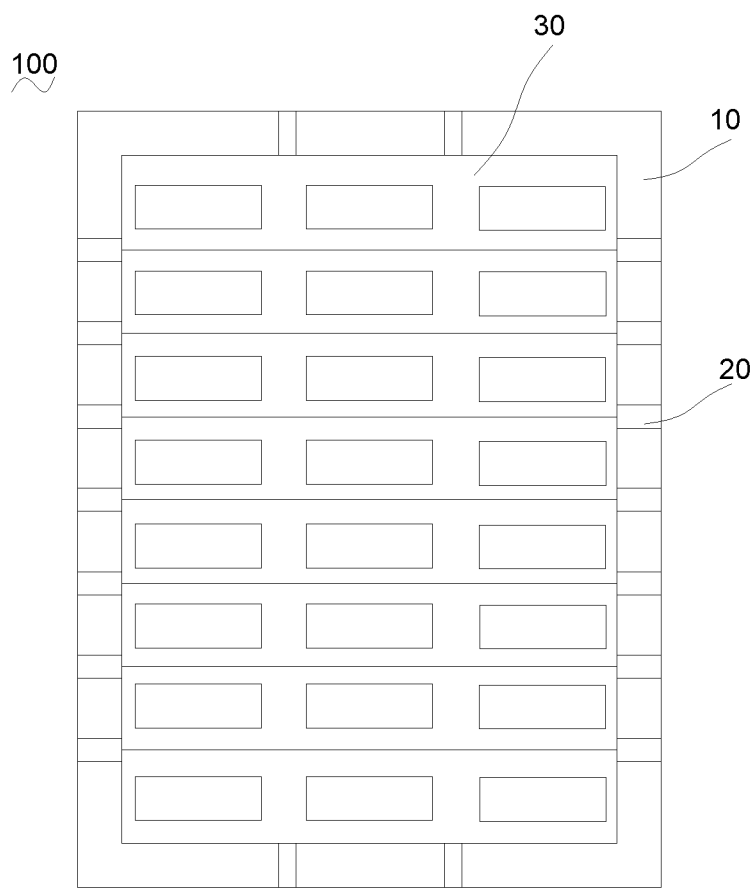
FIG. 8 is a top view of an embodiment of a mask plate.

Referring to FIG. 3 and FIG. 8, an embodiment of the present application provides a support strip 20 and a mask plate 100. The support strip 10 has a support region 21 and a clamped region 22. The portion of the support strip 20, located in the support region 21, is configured to support a mask strip 30 of the mask plate 100 and shield a gap between mask strips 30. The portion of the support strip 20 located in the clamped region 22 is clamped during the mask stretching process to exert a tensile force (i.e., the axial force P) to the support strip 20. After the mask stretching process, the portion of the support strip 20 located in the clamped region 22 is fixedly connected to a frame 10 of the mask plate 100. Specifically, after the mask stretching process, the portion of the support strip 20 located in the clamped region 22 can be welded to the frame 10.

The support strip 20 includes a main body 211, an irregular portion, and a clamped portion. Both the main body 211 and the irregular portion are disposed in the support region 21, and the clamped portion is disposed in the clamped region 22. The main body 211 has two sides in the first direction and two ends in the second direction. The first direction and the second direction are perpendicular to each other. The irregular portion is formed on at least one of the two sides of the main body 211, and the clamped portion is located at the two ends of the main body 211. Both the first direction and the second direction are in a plane in which the top surface of the support strip 20 is located. In the present embodiment, the first direction is the non-pulling direction, i.e., the direction X, and the second direction is the pulling direction, i.e., the direction Y. The support strip 20 is generally a long stripe, the first direction is a width direction of the support strip 20, and the second direction is a length direction of the support strip 20.

Since the support strip 20 includes the irregular portion, the entire support strip 20 is structurally asymmetric, so that the force line of the axial force P and the main centroid axis of the support strip 20 are parallel to but do not coincide with each other, resulting in the eccentric distance e between the force line of the axial force P and the main centroid axis.

Further, the support region 21 has a first main centroid axis 214 extending in the second direction, and the main body 211 has a first central axis 2111 extending in the second direction. Due to the existence of the irregular portion, the first central axis 2111 and the first main centroid axis 214 are parallel to but do not coincide with each other. The clamped portion has a second central axis 223 extending in the second direction. The force line of the axial force P coincides with the second central axis 223. The second central axis 223 is located on the side of the first central axis 2111 adjacent to the first main centroid axis 214.

In the support strip 20 provided by the present embodiment, the second central axis 223 is located on the side of the first central axis 2111 adjacent to the first main centroid axis 214; that is, the force line of the axial force P is located on the side of the first central axis 2111 adjacent to the first main centroid axis 214. By setting the position of the clamped portion relative to the main body 211, the second central axis 223 of the clamped portion is offset to the side of the first central axis 2111 adjacent to the first main centroid axis 214. In this way, the distance between the force line of the axial force P and the first main centroid axis 214 is reduced, so that the distance between the force line of the axial force P and a second main centroid axis (not shown in the drawings) of the entire support strip 20 is reduced. Thus, the eccentric distance e is reduced, and the bending moment is reduced accordingly, thereby reducing the position shift of the support strip 20 in the non-pulling direction (i.e., the width direction of the support strip 20), improving the shielding effect of the support strip 20, and thus improving the display effect of the display screen formed by using the mask plate in the evaporation and deposition process.

In an embodiment, the irregular portion includes a protrusion 212. The protrusion 212 protrudes outward from the main body 211 in the first direction X, i.e., the protrusion 212 protrudes outward from one side of the main body 211. The support strip 20 including the irregular portion protruded out from the main body 211 in the first direction X can shield a deposition region to form an irregular pattern.

The number of the protrusions 212 can be one or more, which is not limited herein.

In an embodiment, a plurality of protrusions 212 are disposed on and protrude from a same side of the main body 211, and the plurality of protrusions 212 are arranged at intervals in the second direction. In another embodiment, a part of the plurality of protrusions 212 are disposed on and protrude from one side of the main body 211, and the rest of the plurality of protrusions 212 are disposed on and protrude from another side of the main body 211. The protrusions 212 on the same side of the main body 211 are arranged at intervals in the second direction.

The shape of the top surface of the protrusion 212 or the shape of the cross-section of the protrusion 212 parallel to the top surface can be a regular shape, such as a rectangle, or can be an irregular shape, such as an arc, which can be determined according to the shape of the pattern to be deposited and is not limited herein.

In an embodiment, the number of the protrusions 212 is two, and the two protrusions 212 are spaced from each other in the second direction. The number of the protrusions 212 is not limited herein, and in other embodiments, the number of the protrusions 212 can be three or more.

In the case that the protrusions 212 are all disposed on and protrude from the same side of the main body 211, the first main centroid axis 214 of the support portion 21 is located on the side of the first central axis 2111 adjacent to the protrusions 212, the second main centroid axis of the support strip 20 is located on the side of the first main centroid axis 214 adjacent to the protrusions 212, and the second central axis 223 of the clamped portion is located on the side of the first main centroid axis 214 away from the protrusions 212. In this way, the distance between the force line of the axial force P and the second main centroid axis (not shown) of the entire support strip 20 is reduced. Thus, the eccentric distance e is reduced, and the bending moment is reduced accordingly, thereby reducing the position shift of the support strip 20 in the non-pulling direction (i.e., the width direction of the support strip 20), improving the shielding effect of the support strip 20, and thus improving the display effect of the display screen formed by using the mask plate in the evaporation and deposition process.

Figure 4:
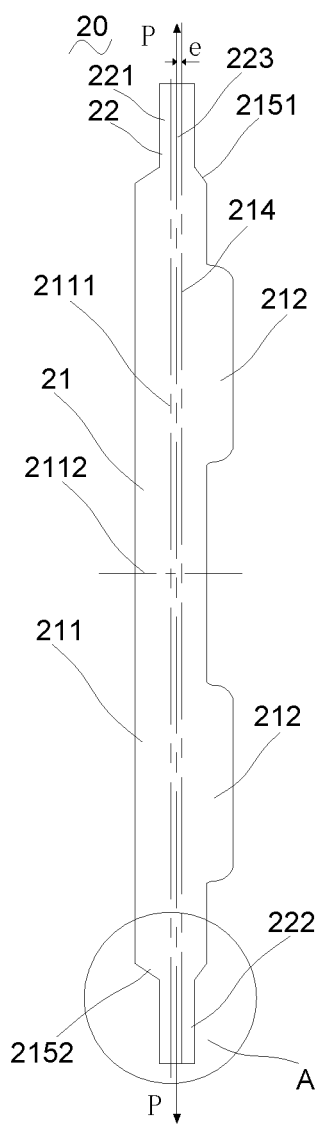
FIG. 4 is a top structural view of another embodiment of a support strip.

Referring to FIG. 4, the size of the clamped portion in the first direction (i.e., the width of the clamped portion) is smaller than the size of the main body 211 in the first direction (i.e., the width of the main body 211). In another embodiment, the width of the clamped portion can be greater than the width of the main body 211, or the width of the clamped portion can be equal to the width of the main body 211, which is not limited herein.

The clamped portion includes a first clamped portion 221 and a second clamped portion 222. The first clamped portion 221 and the second clamped portion 222 are respectively disposed at the two ends of the main body 211. The first clamped portion 221 shares the second central axis 223 as a common central axis with the second clamped portion 222. Specifically, the width of the first clamped portion 221 is equal to the width of the second clamped portion 222. In other embodiments, the width of the first clamped portion 221 is not equal to the width of the second clamped portion 222, which is not limited herein.

The support region 21 can further include a transition portion, and the transition portion includes a first transition portion 2151 and a second transition portion 2152. The first transition portion 2151 is disposed between the first clamped portion 221 and the main body 211, and the second transition portion 2152 is disposed between the second clamped portion 222 and the main body 211. The first transition portion 2151 is configured for the transition between the first clamped portion 221 and the main body 211, and the second transition portion 2152 is configured for the transition between the second clamped portion 222 and the main body 211. In other embodiments, the transition portion of the support region 21 can be omitted. In this case, the main body 211 of the support region 21 is directly connected to the clamped portion, which is not limited herein.

The main body 211 can define a third central axis 2112 extending in the first direction. The first clamped portion 221 and the second clamped portion 222 are symmetrically arranged with respect to the third central axis 2112. In other embodiments, the first clamped portion 221 and the second clamped portion 222 can be arranged asymmetrically with respect to the third central axis 2112, which is not limited herein.

Figure 5:
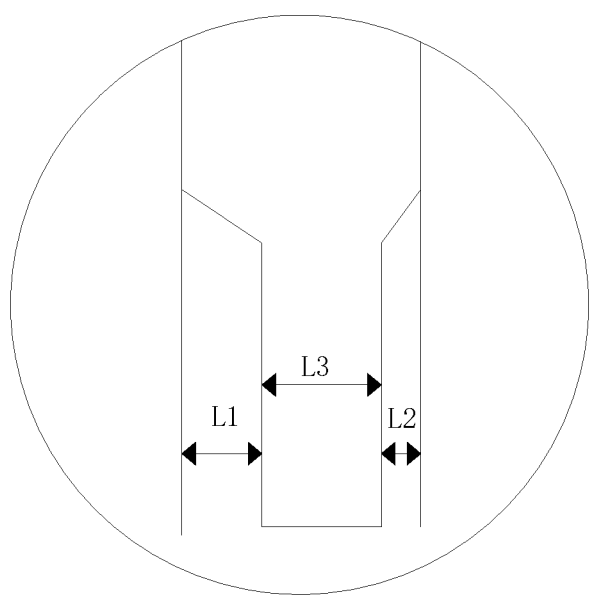
FIG. 5 is an enlarged view of the support strip at the section A shown in FIG. 4.

Referring to FIG. 4 and FIG. 5, in an embodiment, the two sides of the main body 211 are a first side and a second side opposite to each other in the first direction. Each of the first clamped portion 221 and the second clamped portion 222 has a third side and a fourth side opposite to each other in the first direction. The third side and the first side are located on one side, and the fourth side and the second side are located on another side. The distance between the third side and the first side in the first direction is L1. The distance between the fourth side and the second side in the first direction is L2. The sizes of the first clamped portion 221 and the second clamped portion 222 in the first direction are each L3, where $0 < |L1-L2| \leq L3/6$.

By setting $|L1-L2|$ to be greater than 0 and less than or equal to L3/6, the force line of the axial force P can be located within a core region of the support strip 20; that is, the force line of the axial force P can be located within a specific region of the support strip 20 in the X direction. In the case that the force line of the axial force P is located within the core region, the bending moment is reduced, thereby further reducing the position shift of the support strip 20 in the non-pulling direction (i.e., the width direction of the support strip 20), improving the shielding effect of the support strip 20, and thus improving the display effect of the display screen formed by using the mask plate in the evaporation and deposition process.

In an embodiment, the second central axis 223 coincides with the first main centroid axis 214, so as to ensure that the force line of the axial force P coincides with the first main centroid axis 214 of the support region 21 of the support strip 20. In this way, the bending moment is further reduced, thereby further reducing the position shift of the support strip 20 in the non-pulling direction (i.e., the width direction of the support strip 20), improving the shielding effect of the support strip 20, and thus improving the display effect of the display screen formed by using the mask plate in the evaporation and deposition process.

In another embodiment, the second central axis 223 coincides with the second main centroid axis, so as to ensure that the force line of the axial force P coincides with the second main centroid axis of the entire support strip 20 to make the eccentric distance equal to 0, thereby avoiding the position shift of the support strip 20 in the non-pulling direction (i.e., the width direction of the support strip 20), improving the shielding effect of the support strip 20, and thus improving the display effect of the display screen formed by using the mask plate in the evaporation and deposition process.

Figure 6:
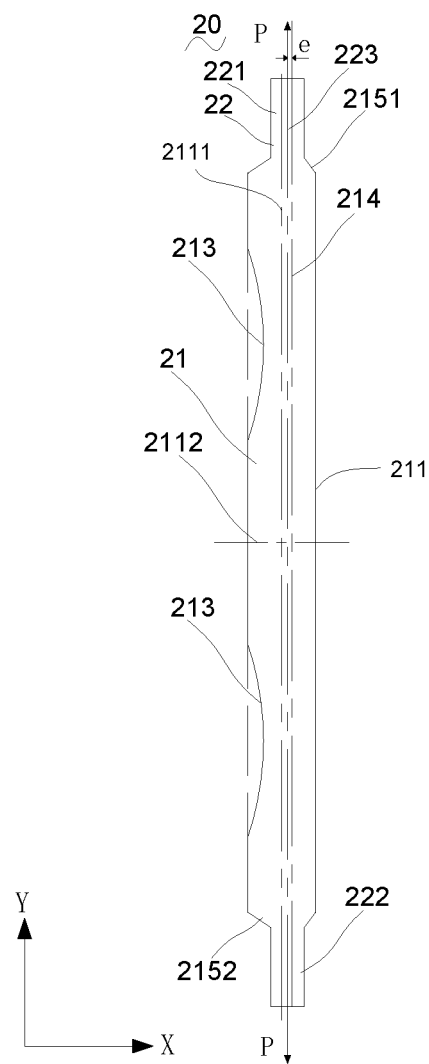
FIG. 6 is a top structural view of yet another embodiment of a support strip whose irregular portion includes recesses.

Referring to FIG. 6, in an embodiment, the irregular portion includes at least one recess 213. The recess 213 is hollowed from the main body 211 in the first direction X; that is, the recess 213 is hollowed inwardly from one side of the main body 211. The number of the recesses 213 can be one or more, which is not limited here.

In an embodiment, a plurality of recesses 213 are hollowed from a same side of the main body 211, and the plurality of recesses 213 are arranged at intervals in the second direction. In another embodiment, a part of the plurality of recesses 213 are hollowed from one side of the main body 211, and the rest of the plurality of recesses 213 are hollowed from another side of the main body 211. The recesses 213 on the same side of the main body 211 are arranged at intervals in the second direction.

The shape of the top surface of the recess 213 or the shape of the cross-section of the recess 213 parallel to the top surface can be a regular shape, such as a rectangle, or can be an irregular shape, such as an arc, which is not limited herein.

In an embodiment, the number of the recesses 213 is two, and the two recesses 213 are spaced from each other in the second direction. The number of recesses 213 is not limited herein, and in other embodiments, the number of the recesses 213 can be three or more.

In the case that the recesses 213 are hollowed from the same side of the main body 211, the first main centroid axis 214 of the support portion 21 is located on the side of the first central axis 2111 of the main body 211 away from the recesses 213, the second main centroid axis of the support strip 20 is located on the side of the first main centroid axis 214 away from the recesses 213, and the second central axis 223 of the clamped portion is located on the side of the first main centroid axis 214 adjacent to the recesses 213. In this way, the distance between the force line of the axial force P and the second main centroid axis of the entire support strip 20 is reduced. Thus, the eccentric distance e is reduced, and the bending moment is reduced accordingly, thereby reducing the position shift of the support strip 20 in the non-pulling direction i.e., the width direction of the support strip 20), improving the shielding effect of the support strip 20, and thus improving the display effect of the display screen formed by using the mask plate in the evaporation and deposition process.

The setting of the clamped portion can be referred to the description in the above-described embodiments, and is not repeated herein.

Figure 7:
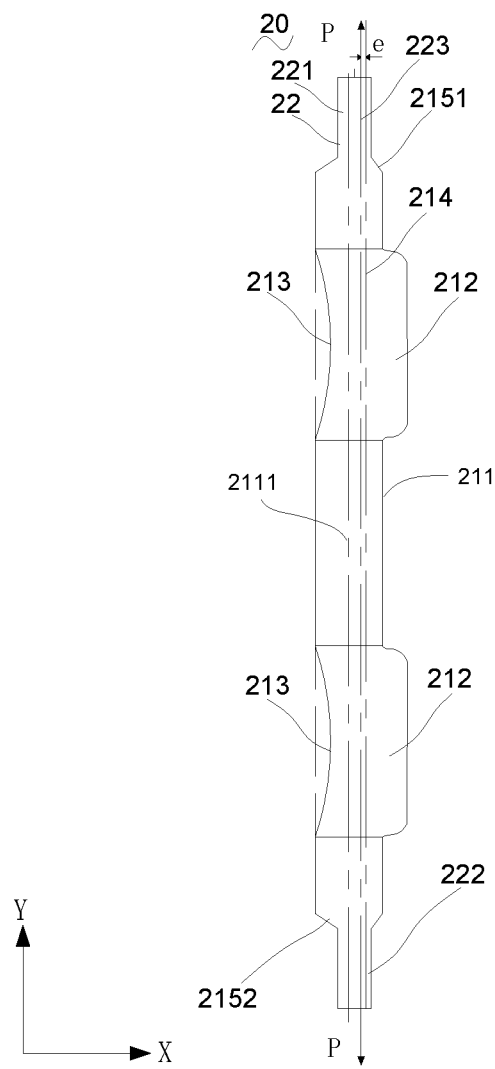
FIG. 7 is a top structural view of yet another embodiment of a support strip whose irregular portion includes a protrusion and a recess.

Referring to FIG. 7, in an embodiment, the irregular portion includes at least one protrusion 212 and at least one recess 213. The at least one protrusion 212 protrude from at least one side of the main body 211, and the at least one recess 213 is hollowed from at least one side of the main body 211.

The numbers of the at least one protrusion 212 and the at least one recess 213 can both be one or more. In other embodiments, the number of the protrusion 212 is one, and the number of the recesses 213 is plural. Alternatively, the number of the at least one protrusion 212 is plural, and the number of the at least one recess 213 is one. Alternatively, the number of the at least one protrusion 212 is one, and the number of the at least one recess 213 is one, and which are not limited herein.

In an embodiment, a plurality of protrusions 212 protrude from a same side of the main body 211, and the plurality of protrusions 212 are arranged at intervals in the second direction; a plurality of recesses 213 are hollowed from another same side of the main body 211, and the plurality of recesses 213 are arranged at intervals in the second direction. In another embodiment, a part of the plurality of protrusions 212 protrude from one side of the main body 211, and the rest of the plurality of protrusions 212 protrude from another side of the main body 211. A part of the plurality of recesses 213 are hollowed from one side of the main body 211, and the rest of the plurality of recesses 213 are hollowed from another side of the main body 211. The protrusions 212 and the recesses 213 on the same side are arranged at intervals in the second direction.

The shape of the top surface of each of the protrusions 212 or the cross-section of each of the protrusions 212 parallel to the top surface can be a regular shape, such as a rectangle, or can be an irregular shape, such as an arc, which is not limited herein. The cross section of each of the recesses 213 can be a regular shape, such as a rectangle, or can be an irregular shape, such as an arc, which is not limited herein.

In an embodiment, the number of the at least one protrusion 212 is two, and two protrusions 212 are arranged at intervals in the second direction. The number of the at least one recess 213 is two, and two recesses 213 are arranged at intervals in the second direction. The numbers of the at least one recess 213 and the at least one protrusion 212 are not limited, and in other embodiments, the numbers of the at least one recess 213 and the at least one protrusion 212 can be three or more.

In the case that the recesses 213 are hollowed from one side of the main body 211 and the protrusions 212 protrude from another side of the main body 211, the first main centroid axis 214 of the support region 21 is located on the side of the first central axis 2111 of the main body 211 adjacent to the protrusions 212, the second main centroid axis of the support strip 20 is located on the side of the first main centroid axis 214 adjacent to the protrusions 212, and the second central axis 223 of the clamped portion is located on the side of the first main centroid axis 214 away from the protrusions 212. In this way, the distance between the force line of the axial force P and the second main centroid axis (not shown) of the entire support strip 20 is reduced. Thus, the eccentric distance e is reduced, and the bending moment is reduced accordingly, thereby reducing the position shift of the support strip 20 in the first direction (i.e., the width direction of the support strip 20), improving the shielding effect of the support strip 20, and thus improving the display effect of the display screen formed by using the mask plate in the evaporation and deposition process.

The setting of the clamped portion can be referred to the description in the above-described embodiments, and is not repeated herein.

Referring back to FIG. 3, above, and to FIG. 8, an embodiment of the present application also provides a mask plate 100 including the aforementioned support strip 20. Since the support strip 20 has the aforementioned beneficial effects, the mask plate 100 including the support strip 20 also has corresponding beneficial effects, which are not repeated herein.

Specifically, the mask plate 100 further includes a frame 10 and a plurality of mask strips 30. The support strip 20 is fixed on the frame 10 to support the mask strips 30 and shield a gap between the mask strips 30 and a part of openings defined by the mask strip 30 for the evaporation and deposition process.

The mask plate 100 can include a plurality of support strips 20 and a plurality of mask strips 30. The plurality of support strips 20 are arranged vertically and horizontally and fixedly connected to the frame 10. The plurality of mask strips 30 are arranged on corresponding support strips 20. The length directions of the plurality of mask strips 30 are parallel to the length directions of at least a part of the support strips 20. The gap between adjacent mask strips 30 is located above the support strip 20.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A support strip having a support region and a clamped region, wherein the support strip comprises:
   a main body disposed in the support region, in a first direction of the main body, the main body having two sides, and in a second direction of the main body, the main body having two ends;
   an irregular portion disposed in the support region and disposed on at least one of the two sides of the main body; and
   a clamped portion disposed in the clamped region and disposed on at least one of the two ends of the main body;

wherein the main body has a first central axis extending along the second direction, and wherein the clamped portion has a second central axis extending along the second direction;
wherein the support region has a first main centroid axis extending along the second direction;
wherein the second central axis of the clamped portion is located on a side of the first central axis of the main body adjacent to the first main centroid axis of the support region; and
wherein the first direction and the second direction are perpendicular to each other, and are parallel to a plane in which a top surface of the main body is located;
wherein the clamped portion comprises:
a first clamped portion disposed at one end of the main body; and
a second clamped portion disposed at the other end of the main body;
wherein sizes of the first clamped portion and the second clamped portion in the first direction are each smaller than a size of the main body in the first direction;
wherein the two sides of the main body are a first side and a second side opposite to each other in the first direction;
wherein each of the first clamped portion and the second clamped portion has a third side and a fourth side opposite to each other in the first direction;
wherein the third sides and the first side are located on a same side of the main body; and
wherein the fourth sides and the second side are located on another same side of the main body;
wherein a distance between the third sides and the first side in the first direction is L1;
wherein a distance between the fourth sides and the second side in the first direction is L2; and
L1<L2 or L1>L2.

2. The support strip according to claim 1, wherein the irregular portion comprises:
at least one protrusion protruding from the main body in the first direction; and/or
at least one recess hollowed from the main body in the first direction.

3. The support strip according to claim 1, wherein the irregular portion comprises a plurality of protrusions protruding from the main body in the first direction and located on a same side of the main body.

4. The support strip according to claim 3, wherein the plurality of protrusions on the same side of the main body are arranged at intervals in the second direction.

5. The support strip according to claim 1, wherein the irregular portion comprises:
a plurality of protrusions protruding from the main body in the first direction;
a part of the plurality of protrusions protrude from one side of the main body; and
the rest of the plurality of protrusions protrude from the other side of the main body.

6. The support strip according to claim 1, wherein the irregular portion comprises a plurality of recesses hollowed from the main body and located on a same side of the main body.

7. The support strip according to claim 6, wherein the plurality of recesses on the same side of the main body are arranged at intervals in the second direction.

8. The support strip according to claim 1, wherein the irregular portion comprises:
a plurality of recesses hollowed from the main body; and
a part of the plurality of recesses are hollowed from one side of the main body;
wherein the rest of the plurality of protrusions are hollowed from the other side of the main body.

9. The support strip according to claim 1, wherein the irregular portion comprises:
a plurality of protrusions protruding from the main body in the first direction; and
a plurality of recesses hollowed from the main body;
wherein the plurality of protrusions are located on one side of the main body;
wherein the plurality of recesses are located on the other side of the main body; and
wherein the second central axis is located on a side of the first main centroid axis away from the protrusions.

10. The support strip according to claim 9, wherein the plurality of protrusions are arranged at intervals in the second direction and the plurality of recesses are arranged at intervals in the second direction.

11. The support strip according to claim 1,
wherein the main body has a third central axis extending in the first direction; and
wherein the first clamped portion and the second clamped portion are symmetrically arranged with respect to the third central axis.

12. The support strip according to claim 1, wherein the size of the first clamped portion in the first direction is equal to the size of the second clamped portion in the first direction.

13. The support strip according to claim 1,
wherein a size of the first clamped portion or the second clamped portion in the first direction is L3, where 0<|L1−L2|≤L3/6.

14. The support strip according to claim 1, wherein the second central axis coincides with the first main centroid axis.

15. The support strip according to claim 1, wherein the support strip has a second main centroid axis extending in the second direction; and
wherein the second central axis coincides with the second main centroid axis.

16. A mask plate, comprising the support strip according to claim 1.

17. The support strip according to claim 1, wherein each of the sizes of the first clamped portion and the second clamped portion in the first direction is L3, and L2<L1<L3<the size of the main body in the first direction.

18. A support strip having a support region and a clamped region, wherein the support strip comprises:
a main body disposed in the support region, in a first direction of the main body, the main body having two sides, and in a second direction of the main body, the main body having two ends;
irregular portions disposed in the support region and disposed on at least one of the two sides of the main body; and
a clamped portion disposed in the clamped region and disposed on at least one of the two ends of the main body;
wherein the main body has a first central axis extending along the second direction, and the irregular portions are asymmetrically distributed with respect to the first central axis of the main body;
wherein the clamped portion has a second central axis extending along the second direction;

wherein the support region has a first main centroid axis extending along the second direction;

wherein the second central axis of the clamped portion is located on a side of the first central axis of the main body adjacent to the first main centroid axis of the support region; and wherein the first direction and the second direction are perpendicular to each other, and are parallel to a plane in which a top surface of the main body is located.

19. The support strip according to claim 18, wherein the irregular portions comprise a recess and/or a protrusion, and the irregular portions are disposed on only one of the two sides of the main body, and the other of the two sides of the main body is without any recess or protrusion; or wherein the irregular portions comprise a protrusion and a recess, and the protrusion and the recess are respectively disposed on the two sides of the main body and aligned with each other in the first direction.

20. The support strip according to claim 18, wherein the two sides of the main body are a first side and a second side opposite to each other in the first direction, wherein the irregular portion comprises a plurality of protrusions and a plurality of recesses; some of the plurality of protrusions protrude from the first side of the main body, and the rest of the plurality of protrusions protrude from the second side of the main body; and some of the plurality of recesses are hollowed from the first side of the main body, and the rest of the plurality of recesses are hollowed from the second side of the main body.

* * * * *